United States Patent
Chari et al.

(10) Patent No.: US 7,880,473 B2
(45) Date of Patent: Feb. 1, 2011

(54) NON-INVASIVE MONITORING AND DIAGNOSIS OF ELECTRIC MACHINES BY MEASURING EXTERNAL FLUX DENSITY

(75) Inventors: Madabushi Venkatakrishnama Chari, Burt Hills, NY (US); Sameh Ramadan Salem, Rexford, NY (US); Sheppard Salon, Schenectady, NY (US); O-Mun Kwon, Troy, NY (US)

(73) Assignee: General Electric Company, Schenectady, NY (US)

( * ) Notice: Subject to any disclaimer, the term of this patent is extended or adjusted under 35 U.S.C. 154(b) by 389 days.

(21) Appl. No.: 12/058,856

(22) Filed: Mar. 31, 2008

(65) Prior Publication Data

US 2009/0243647 A1    Oct. 1, 2009

(51) Int. Cl.
G01R 31/34 (2006.01)
(52) U.S. Cl. ..................................... 324/529
(58) Field of Classification Search .............. 324/158.1, 324/510–511, 529, 772, 200, 244; 73/12.09, 73/12.12, 865.8
See application file for complete search history.

(56) References Cited

U.S. PATENT DOCUMENTS 6,262,550 B1   7/2001   Kliman et al.

2005/0046414 A1*   3/2005   Payne et al. .................. 324/200
2009/0219030 A1*   9/2009   Salem et al. ................. 324/510

FOREIGN PATENT DOCUMENTS

| EP | 0552291 A2 | 7/1993 |
| GB | 2338848 A | 12/1999 |
| JP | 07311233 A | 5/1994 |
| RU | 2117957 C1 | 8/1996 |

OTHER PUBLICATIONS

Search Report of the Great Britain Intellectual Property Office on Jun. 22, 2009 for related Great Britain Application No. GB0905137.6.

* cited by examiner

Primary Examiner—Ha Tran T Nguyen
Assistant Examiner—Trung Q Nguyen
(74) Attorney, Agent, or Firm—Sutherland Asbill & Brennan LLP

(57) ABSTRACT

System and methods for monitoring electric machines are provided. A magnetic field associated with the electric machine is measured at one or more points external to the electric machine, wherein a respective magnetic field value is associated with each of the one or more points. The one or more measured magnetic field values are compared to one or more corresponding expected values, and a determination of whether a fault is present in the electric machine is made based at least in part on the comparison.

20 Claims, 5 Drawing Sheets

NON-INVASIVE MONITORING AND DIAGNOSIS OF ELECTRIC MACHINES BY MEASURING EXTERNAL FLUX DENSITY

FIELD OF THE INVENTION

The invention relates generally to systems and methods for monitoring electric machines and, more specifically, to systems and methods for non-invasive monitoring of electrical machines by measuring external flux density.

BACKGROUND OF THE INVENTION

Electric machines, such as electric motors and electric generators, are utilized in a wide variety of applications. During the life cycle and operation of an electric machine, it is often desirable to monitor the machine in order to identify defects, faults, and/or other maintenance issues that might occur.

Conventional methods for monitoring an electric machine include various methods for monitoring the electric machine while it is offline and methods for monitoring the electric machine while it is online. Methods for monitoring the electric machine while it is offline, however, involve powering down the electric machine, which leads to lost work and/or power generation by the electric machine.

Conventional methods for monitoring the electric machine while it is online include the placement of various sensors within the electric machine in order to take various measurements associated with the electric machine, such as temperature, voltage, and/or current measurements. However, the placement of sensors within the electric machine is an invasive process often requiring the machine to be at least partially deconstructed. Additionally, given the numerous moving parts associated with the electric machine, it is often not feasible to place sensors at every desirable location.

Accordingly, there is a need for improved systems and methods for monitoring electric machines. There is also a need for improved systems and methods for monitoring electric machines while they are online.

BRIEF DESCRIPTION OF THE INVENTION

According to one embodiment of the invention, a method is provided for monitoring electric machines. A magnetic field associated with the electric machine is measured at one or more points external to the electric machine, wherein a respective magnetic field value is associated with each of the one or more points. The one or more measured magnetic field values are compared to one or more corresponding expected values, and a determination of whether a fault is present in the electric machine is made based at least in part on the comparison.

According to another embodiment of the invention, a system is provided for monitoring electric machines. The system may include at least a plurality of sensors and a control unit. The plurality of sensors are operable to measure a magnetic field associated with the electric machine at a plurality of respective points external to the electric machine. The control unit is operable to receive the plurality of measurements from the plurality of sensors and to determine a combined value of the magnetic field based at least in part on the plurality of measurements. The control unit is further operable to compare the combined value to one or more expected values of the magnetic field and to determine, based at least in part on the comparison, whether a fault is present in the electric machine.

According to yet another embodiment of the invention, a method is provided for monitoring an electric machine. At least one value for a magnetic field associated with the electric machine is determined. The at least one determined value is compared to at least one corresponding expected value. The method also included determining whether a fault is present in the electric machine based at least in part on the comparison.

Other embodiments, aspects, features, and advantages of the invention will become apparent to those skilled in the art from the following detailed description, the accompanying drawings and the appended claims.

BRIEF DESCRIPTION OF THE DRAWINGS

Figure 1:
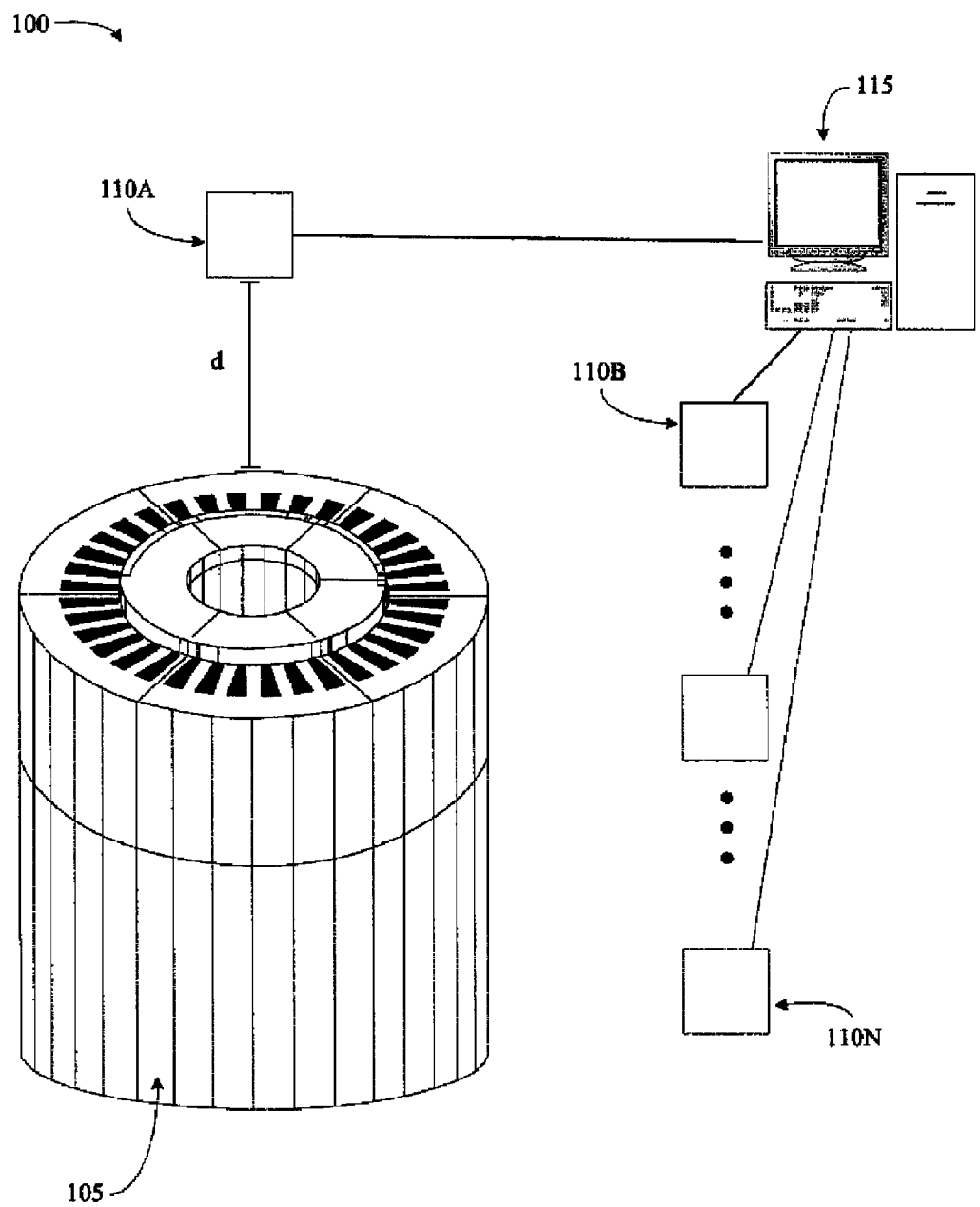

Having thus described the invention in general terms, reference will now be made to the accompanying drawings, which are not necessarily drawn to scale, and wherein:

FIG. 1 is a schematic diagram of one example of a system that may be utilized to monitor an electric machine, according to an illustrative embodiment of the invention.

Figure 2:
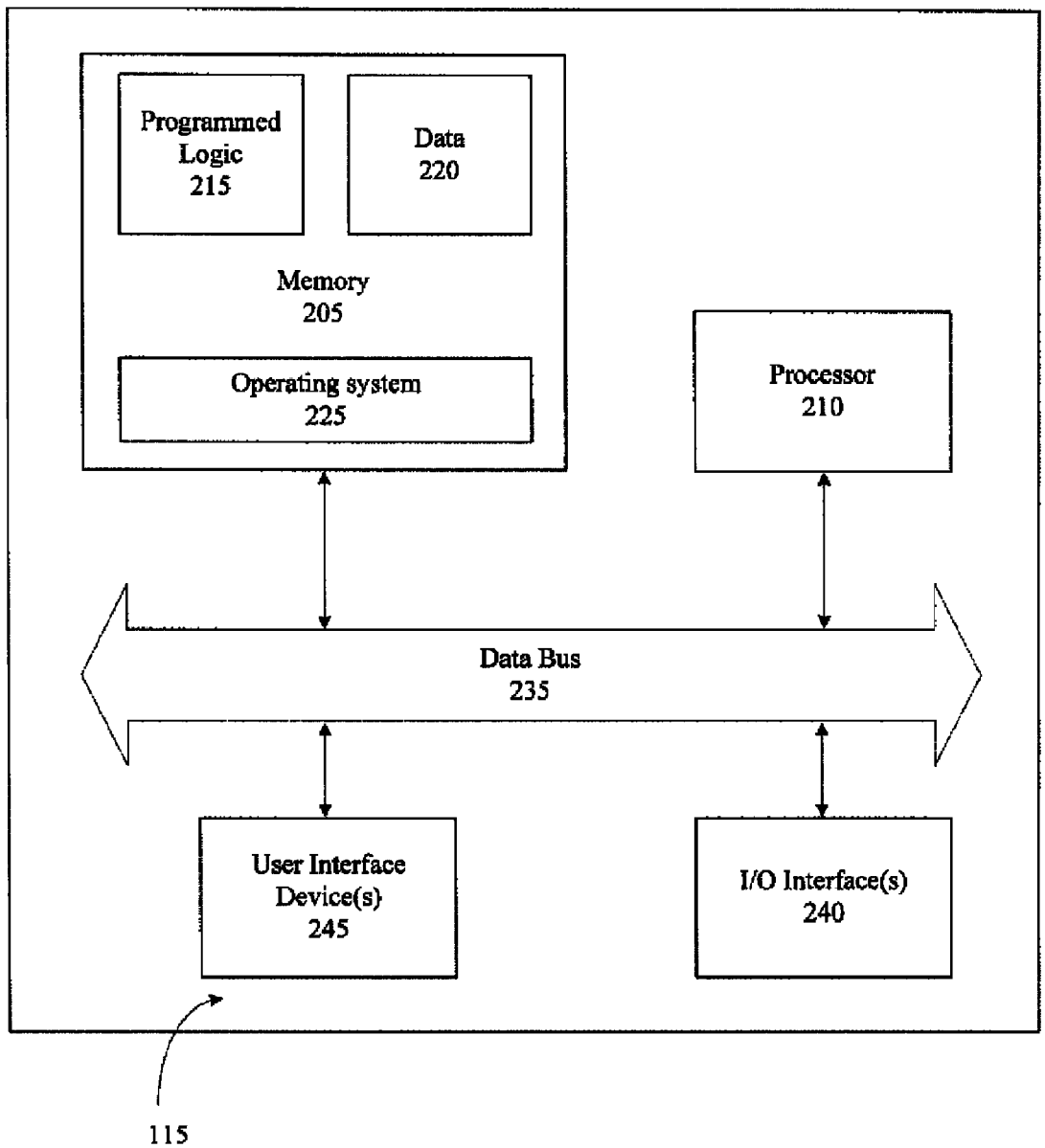

FIG. 2 is a block diagram of one example of a control unit that may be utilized in accordance with various embodiments of the invention.

Figure 3:
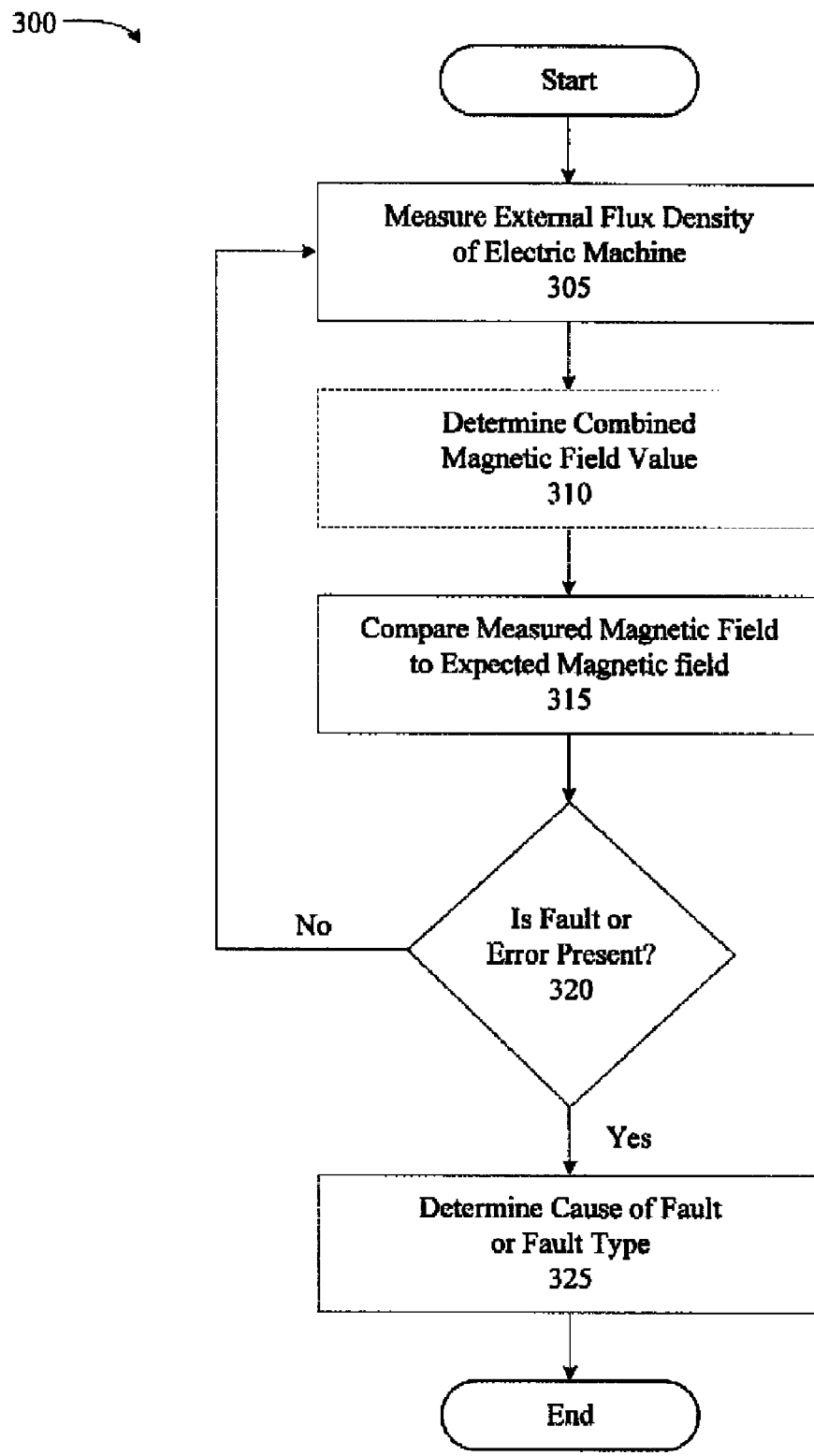

FIG. 3 is a flow chart of one example of a method for monitoring an electric machine, according to an illustrative embodiment of the invention.

Figure 4A:
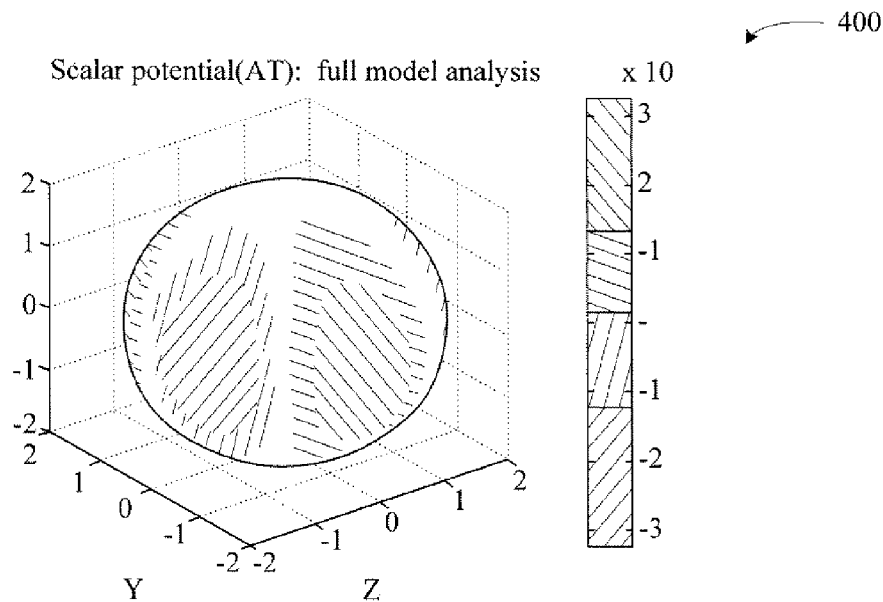
Figure 4B:
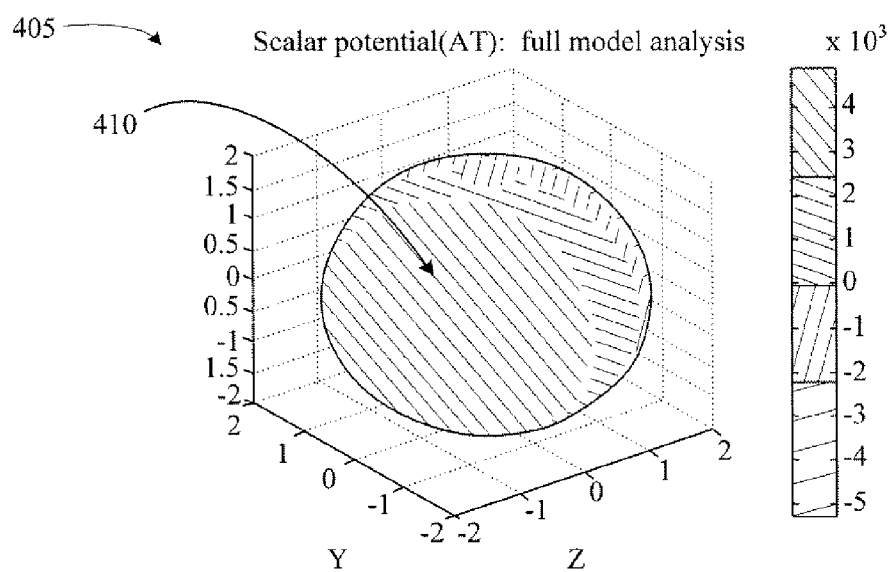

FIGS. 4A and 4B are a graphical representation of one example of identifying a fault in an electric machine, according to an illustrative embodiment of the invention.

Figure 5A:
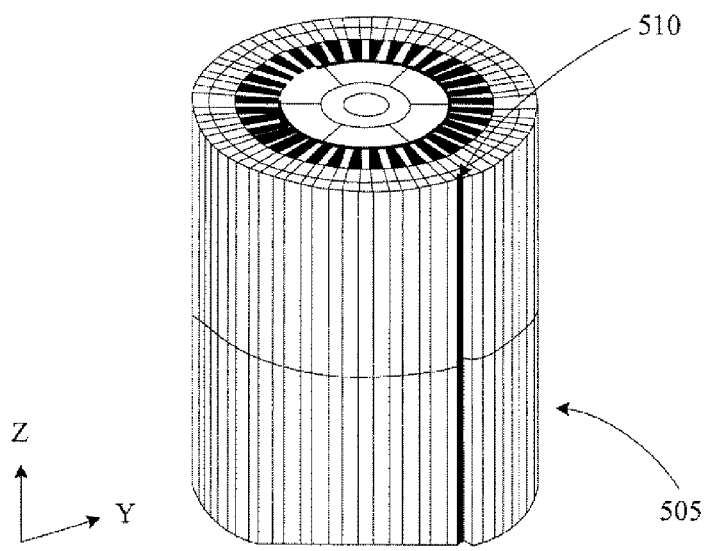
Figure 5B:
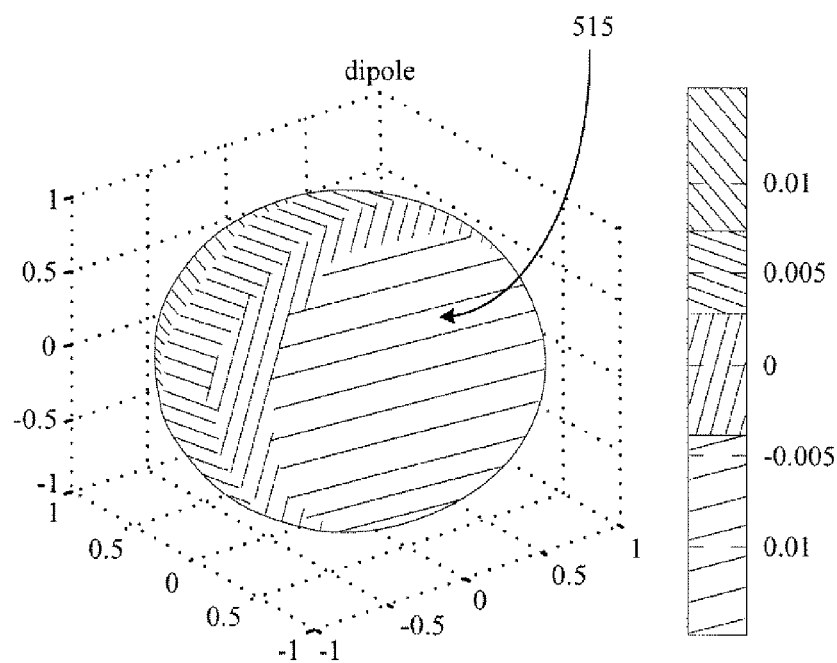

FIGS. 5A and 5B are a graphical representation of another example of identifying a fault in an electric machine, according to an illustrative embodiment of the invention.

DETAILED DESCRIPTION OF THE INVENTION

Illustrative aspects of the invention now will be described more fully hereinafter with reference to the accompanying drawings, in which some, but not all aspects of the invention are shown. Indeed, the invention may be embodied in many different forms and should not be construed as limited to the aspects set forth herein; rather, these aspects are provided so that this disclosure will satisfy applicable legal requirements. Like numbers refer to like elements throughout the description and drawings.

Exemplary aspects of the invention will be described with reference to the figures, in which like numerals indicate like elements throughout the several drawings.

Disclosed are systems and methods for monitoring electric machines. In one embodiment, one or more suitable sensors may facilitate the measurement of a magnetic field associated with an electric machine at one or more points external to the electric machine. The measured magnetic field may be compared to one or more pre-stored or predetermined expected values for the magnetic field. Faults or asymmetries may be diagnosed, identified, or otherwise determined based at least in part on the comparison. In this regard, the electric machine may be monitored during its operation in a non-invasive manner. It will be appreciated that the various embodiments of the invention may be utilized to monitor a wide variety of electric machines such as, for example, electric motors and electric generators.

FIG. 1 is a schematic diagram of one example of a system 100 that may be utilized to monitor an electric machine 105, according to an illustrative embodiment of the invention. The system 100 may include, among other things, an electric machine 105, one or more sensors 110A-N, and at least one suitable control unit, such as control unit 115.

The electric machine 105 may be any electric machine that is capable of generating, emitting, or otherwise having an associated magnetic field, electric field, and/or electromagnetic field. For example, the electric machine 105 that is monitored may be any electric motor or electric generator. In certain embodiments of the invention, the electric machine 105 may be a brushless direct current (DC) motor. By way of example only, a brushless DC motor is described herein as an electric machine 105 that may be monitored.

The one or more sensors 110A-N may include any number of suitable sensors that facilitate the measurement of a field associated with the electric machine 105. In accordance with an aspect of the invention, each of the one or more sensors 110A-N may be operable to measure one or more magnetic fields generated by or associated with the electric machine 105. In some embodiments of the invention, each of the one or more sensors 110A-N may be operable to measure the external flux density of the electric machine 105. For example, one or more fluxgate magnetometers or other magnetic flux sensors may be utilized as desired to measure the one or more magnetic fields or the magnetic flux that generated by or associated with the electric machine 105. According to an aspect of the invention, one or more vector fluxgate magnetometers may be utilized as desired in various embodiments of the invention; however, it will be appreciated that a wide variety of different types of magnetometers may be utilized such as, for example, rotating coil magnetometers, hall effect magnetometers, proton precision magnetometers, overhauser magnetometers, and/or cesium vapor magnetometers. Either scalar or vector magnetometers may be utilized with certain embodiments of the invention. Additionally, orthogonal vector magnetometers may be utilized in certain embodiments of the invention in order to facilitate the identification of magnetic field strength, inclination, and/or declination.

Although the one or more sensors 110A-N are described herein as sensors utilized in a system 100 that facilitates the monitoring of an electric machine 105 based on one or more magnetic fields generated by or associated with the electric machine 105, it will be appreciated that certain embodiments of the invention may also monitor an electric machine 105 based on one or more electric fields and/or electromagnetic fields generated by or associated with the electric machine. Additionally, it will be appreciated that certain embodiments of the invention may monitor an electric machine 105 based on a combination of different types of fields generated by or associated with the electric machine 105.

According to an aspect of the invention, the one or more sensors 110A-N may be situated external to the electric machine 105. In this regard, the electric machine 105 may be monitored in a non-invasive manner. Additionally, the electric machine 105 may be monitored while it is on-line or while it is operating. Although the one or more sensors 110A-N are depicted in FIG. 1 as being situated external to the electric machine 105, it will be appreciated that one or more sensors may additionally be situated within or otherwise mounted to the electric machine 105 as desired in certain embodiments of the invention.

The one or more sensors 110A-N may each be situated at approximately the same distance from the electric machine 105, shown in FIG. 1 as distance "d" It will be appreciated that a wide variety of distances for "d" may be utilized in various embodiments of the invention such as, for example, a distance of approximately one meter. Additionally, certain embodiments of the invention may utilize a plurality of sensors that are situated at varying distances from the electric machine 105.

Any number of sensors 110A-N may be utilized as desired in various embodiments of the invention. According to an aspect of the invention, greater resolution and/or accuracy in measuring and/or determining a magnetic field generated by or associated with the electric machine 105 may be achieved by increasing the number of sensors 110A-N utilized. Additionally, increasing the number of sensors 110A-N utilized may increase the sensitivity of the system 100 and the ability to identify one or more faults in the electric machine 105. Increasing the number of sensors 110A-N may also facilitate and/or assist in localizing a detected fault within the electric machine 105.

With continued reference to FIG. 1, at least one control unit, such as control unit 115, may be provided. For purposes of this disclosure, it will be assumed that a single control unit 115 is utilized. A wide variety of different types of control units may be utilized as desired in various embodiments of the invention, for example, a personal computer, a server, a microcontroller, a application specific circuit, a minicomputer, etc.

The control unit 115 may be in communication with the one or more sensors 110A-N via any number of suitable network connections, for example, wired connections, wireless connections, local area network connections, direct connections, wide area network connections, the Internet, etc. The control unit 115 may receive measurements data from the one or more sensors 110A-N via the network connections. It will be appreciated that, if analog measurements are output by the one or more sensors 110A-N, then the analog measurements may be processed or converted by any number of suitable analog-to-digital converters prior to be communicated to the control unit 115.

The control unit 115 may also be in communication with the electric machine 105 and/or any number of control units, controllers, and/or control systems (not shown) that control the operation of the electric machine 105. Alternatively, the control unit 115 may control the operation of the electric machine 105. In this regard, the control unit 115 may receive data associated with the operation of the electric machine 105 such as, for example, data associated with a mode of operation for the electric machine 105 (e.g., on/off, online/offline), data associated with the rotation and/or rotation direction of the electric machine 105, data associated with the rotational speed and/or velocity of the electric machine 105, data associated with the torque of the electric machine 105, data associated with a power factor of the electric machine 105, data associated with a load of the electric machine 105, etc. A wide variety of data associated with the operation of the electric machine 105 may be monitored and/or received by the control unit 115 as desired and utilized in various embodiments of the invention.

The control unit 115 may utilize measurements data received from the one or more sensors 110A-N in order to monitor the electric machine 105 and to identify any faults and/or asymmetries in the electric machine 105. The control unit 115 may compare received measurements data associated with a magnetic field generated by or associated with the electric machine 105 to one or more pre-stored or predetermined expected values for the magnetic field. Faults or asymmetries in the electric machine 105 may be diagnosed, identified, or otherwise determined by the control unit 115 based at least in part on the comparison. The pre-stored or predetermined expected values may be stored in one or more suitable memory devices associated with the control unit 115.

The expected values may be obtained from a wide variety of different sources, such as a simulation of the electric machine 105 or by monitoring the electric machine 105 or a similar machine during one or more test or control periods.

As an example of comparing measurements data to expected values, the control unit 115 may compare the received measurements data to one or more expected values or to one or more ranges of expected values for the magnetic field. The expected values or ranges of expected values may represent an expected magnetic field for the electric machine 105 if it is operating within normal and/or acceptable parameters or conditions. The control unit 115 may identify faults in the electric machine 105 if differences or discrepancies exist between the received measurements data and the one or more expected values.

Additionally, it will be appreciated that if a plurality of sensors 110A-N are utilized to measure the magnetic field generated by or associated with the electric machine 105, then a combined value of the magnetic field generated by or associated with the electric machine 105 may be determined based at least in part on the plurality of individual measurements received from the respective sensors 110A-N. In other words, the magnetic field may be represented as a sum of its various components. In accordance with certain embodiments of the invention, the combined value of the magnetic field may be determined based at least in part on an integration of the received measurements data. Additionally, the magnetic field may be decomposed into spherical or cylindrical harmonics as desired in certain embodiments of the invention, and the harmonics may be compared to one or more expected values.

In embodiments of the invention where the control unit 115 monitors and/or receives data associated with the operation of the electric machine 105, then it will be appreciated that the one or more expected values (or one or more ranges of expected values) may be determined based at least in part on at least a portion of the data associated with the operation of the electric machine 105. Adjustments may be made to predetermined expected values or, alternatively, predetermined expected values may be selected from a group of different values based at least in part on the data associated with the operation of the electric machine 105.

In accordance with certain embodiments of the invention, the control unit 105 may determine a type of fault or asymmetry that is identified in the electric machine 105. The presence of certain faults or asymmetries within the electric machine 105 may lead to a relatively predictable magnetic field being emitted by the electric machine 105. The control unit 115 may identify a type of fault or asymmetry based at least in part on a recognition of the magnetic field that is emitted by the electric machine 105. The identification of a fault type may be accomplished by recognizing, diagnosing, or identifying certain characteristics associated with the emitted magnetic field such as, for example, dipoles. Additionally, the identification of a fault type may be based at least in part on a comparison of at least a portion of the measurements data to one or more pre-stored or predetermined data values associated with the fault type.

For purposes of this disclosure, the pre-stored or predetermined data values associated with a fault type may be referred to as a "fault signature." According to certain embodiments of the invention, at least a portion of the measurements data may be compared to one or more fault signatures, and a fault type may be identified based at least in part on the comparison. Once the fault type is identified, appropriate maintenance recommendations may be made in order to facilitate the proper maintenance and/or repair of the electric machine 105.

A wide variety of different fault types and/or asymmetries may be identified as desired in accordance with embodiments of the invention. Examples of fault types and/or asymmetries that may be identified for the electric machine 105 include, but are not limited to, unbalanced poles, rotor eccentricities, stator eccentricities, regions of core permeability, regions of core shorting, regions of core burning, shorted field turns, load unbalances, excitations, grounding faults, and/or misalignment of various components of the electric machine 105.

FIG. 2 is a block diagram of one example of a control unit that may be utilized in accordance with various embodiments of the invention such as, for example, the control unit 115 depicted in FIG. 1. The control unit 115 may include a memory 205 that stores programmed logic 215 (e.g., software) in accordance with embodiments of the invention. The memory 205 may also include data 220 utilized in the operation of the invention and an operating system 225. The data 220 may include, for example, one or more measurements received from one or more sensors, such as sensors 110A-N, that are utilized to measure a magnetic field generated by or associated with a monitored electric machine, such as electric machine 105. The data 220 may also include one or more expected values for a magnetic field and/or one or more expected values associated with fault types that may be identified. A processor 210 may utilize the operating system 225 to execute the programmed logic 215, and in doing so, may also utilize the data 220. A data bus 235 may provide communication between the memory 205 and the processor 210. The control unit 115 may be in communication with external devices, such as sensors 110A-N, via one or more suitable input output (I/O) interfaces 240. Users may interface with the control unit 115 via one or more user interface device(s) 245 such as a keyboard, mouse, control panel, or any other devices capable of communicating data to the control unit 115. The control unit 115 and the programmed logic 215 implemented thereby may comprise software, hardware, firmware or any combination thereof. Further, it will be appreciated that a suitable control unit utilized in accordance with embodiments of the invention may include more or less than all of the components illustrated in FIG. 2.

FIG. 3 is a flow chart of one example of a method 300 for monitoring an electric machine, according to an illustrative embodiment of the invention. The method may be utilized to monitor a wide variety of different electric machines such as, for example, the electric machine 105 depicted in FIG. 1. The method 300 may begin at block 305.

At block 305, the external flux density of the electric machine 105 may be measured or determined at one or more points external to the electric machine 105. Additionally or alternatively, the magnetic field generated by or associated with the electric machine 105 may be measured or determined at one or more points external to the electric machine 105. The measurement of the external flux density or the generated magnetic field may be facilitated by one or more respective sensors such as, for example, the sensors 110A-N depicted in FIG. 1. Following the measurement(s) at block 305, operations may continue at block 310.

At block 310, which may be optional in some embodiments of the invention, a combined value of the magnetic field generated by or associated with the electric machine 105 may be determined. The combined value of the magnetic field generated by or associated with the electric machine 105 may be determined based at least in part on an integration of the plurality of individual measurements received from respective sensors 110A-N. In other words, the magnetic field may be represented as a sum of its various components. Following the determination of a combined magnetic field value at block 310, operations may continue at block 315.

At block 315, the measured magnetic field, whether it be a combined magnetic field value or one or more measured individual values, may be compared to one or more pre-stored or predetermined expected values or ranges of expected values for the magnetic field. Faults and/or asymmetries in the electric machine 105 may be identified based at least in part on the comparison.

At block 320, a determination may be made as to whether any faults and/or asymmetries are identified. If, it is determined at block 320 that no faults or asymmetries are identified or present, then operations may continue at block 305 and the electric machine 105 may continue to be monitored. Alternatively, the method 300 may end. If, however, it is determined at block 320 that at least one fault and/or asymmetry is identified based at least in part on the comparison, then operations may continue at block 325.

At block 325, a fault type or cause of an identified fault may be determined. A fault type may be determined by comparing the measured magnetic field value(s) to one or more predetermined or pre-stored fault signatures associated with various types of faults that may be diagnosed for the electric machine 105. It will be appreciated that a wide variety of different fault types may be tested for and identified as desired in embodiments of the invention.

The method 300 may end following block 325 or, alternatively, operations may continue at block 305 and the electric machine 105 may continue to be monitored.

It will be appreciated that the operations described above with reference to the method 300 shown in FIG. 3 do not necessarily have to be performed in the order set forth in FIG. 3, but instead may be performed in any suitable order. Additionally, it will be understood that, in certain embodiments of the invention, more or less than all of the operations set forth in FIG. 3 may be performed.

FIGS. 4A and 4B illustrate a graphical representation of one example of identifying a fault in an electric machine, according to an illustrative embodiment of the invention. For purposes of describing FIGS. 4A and 4B, it will be assumed that a monitored electric machine is a brushless DC synchronous motor. The motor may also be a six (6) pole surface mounted magnet machine.

FIG. 4A is a graphical representation of a magnetic field 400 that may be generated by the motor in a situation where the poles of the motor are properly balanced. With reference to FIG. 4A, the magnetic field 400 generated by the motor and the six (6) pole distribution is shown. The magnetic field 400 depicted in FIG. 4A is the magnetic potential of the magnetic field measured at a distance of approximately one meter from the motor. A combined field has been determined from various measured field components, and the combined field is illustrated in FIG. 4A.

FIG. 4B is a graphical representation of a magnetic field 405 that may be generated by or associated with the motor in a situation where the six pole motor is unbalanced. As with FIG. 4A, the magnetic field 405 depicted is a combined magnetic potential at a distance of approximately one meter from the motor. FIG. 4B illustrates the magnetic field 405 in a situation where one of the poles (i.e., magnets) has been weakened by a relatively small percentage. This weakening may be caused by core burning within the motor.

As shown in FIG. 4B, a dipole 410 may be created in this situation in the direction of the pole that is different. This dipole may be identified and the unbalanced motor may be diagnosed by various embodiments of the invention.

FIGS. 5A and 5B are graphical representations of another example of identifying a fault in an electric machine, according to an illustrative embodiment of the invention. FIG. 5A illustrates a brushless DC synchronous motor 505 that includes a notch 510 in the stator. The notch 510 may cause a relatively large dipole in the magnetic field generated by the motor 505, as shown in FIG. 5B as 515. The dipole 515 or dipole component may be identified by various embodiments of the invention and traced back to the notch 510. In this regard, the stator notch fault may be identified.

The examples depicted in FIGS. 4A, 4B, 5A and 5B are merely representative of different types of faults that may be identified in accordance with certain embodiments of the invention. It will be appreciated that a wide variety of different types of faults may be identified as desired by various embodiments of the invention.

Various embodiments of the invention are described with reference to block diagrams of systems, methods, apparatuses and computer program products. It will be understood that each block of the block diagrams, and combinations of blocks in the block diagrams, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functionality of each block of the block diagrams, or combinations of blocks in the block diagrams discussed in detail in the descriptions below.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational elements to be performed on the computer or other programmable apparatus to produce a computer implemented process such that the instructions that execute on the computer or other programmable apparatus provide elements for implementing the functions specified in the block or blocks.

Accordingly, blocks of the block diagrams support combinations of means for performing the specified functions, combinations of elements for performing the specified functions and program instruction means for performing the specified functions. It will also be understood that each block of the block diagrams, and combinations of blocks in the block diagrams, can be implemented by special purpose hardware-based computer systems that perform the specified functions or elements, or combinations of special purpose hardware and computer instructions.

Various embodiments of the invention may be implemented through an application program running on an operating system of a computer. Such embodiments also may be practiced with other computer system configurations, including hand-held devices, multiprocessor systems, microprocessor based or programmable consumer electronics, mini-computers, mainframe computers, etc.

Application programs that are components of embodiments of the invention may include routines, programs, components, data structures, etc. that implement certain abstract data types, perform certain tasks, actions, or tasks. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network.

Many modifications and other aspects of the invention set forth herein will come to mind to one skilled in the art to which the invention pertains having the benefit of the teachings presented in the foregoing descriptions and the associated drawings. Therefore, it is to be understood that the invention is not to be limited to the specific aspects disclosed and that modifications and other aspects are intended to be included within the scope of the appended claims. Although specific terms are employed herein, they are used in a generic and descriptive sense only and not for purposes of limitation.

The invention claimed is:

1. A method for monitoring an electric machine, comprising:
   measuring a magnetic field associated with the electric machine at a plurality of points external to the electric machine, wherein a respective magnetic field value is associated with each of the plurality of points;
   determining, by a control unit comprising at least one computer, a combined value of the magnetic field based at least in part on the plurality of measurements;
   comparing, by the control unit, the determined combined value of the magnetic field values to an expected combined value; and
   determining, by the control unit based at least in part on the comparison, whether a fault is present in the electric machine.

2. The method of claim 1, further comprising:
   comparing, by the control unit, the measured magnetic field values to one or more corresponding expected values,
   wherein determining whether a fault is present in the electric machine is further based upon the comparisons of the measured magnetic field values to the corresponding expected values.

3. The method of claim 1, wherein determining a combined value of the magnetic field based at least in part on the plurality of measurements comprises determining a combined value based at least in part on an integration of the plurality of measurements.

4. The method of claim 1, wherein comparing the determined combined value of the magnetic field values to an expected combined value comprises comparing the determined combined value to a range of expected combined values.

5. The method of claim 1, wherein a fault is determined to be present, and further comprising:
   identifying, by the control unit, a fault type associated with the fault based at least in part on comparing the one or more measured magnetic field values to one or more corresponding expected values associated with the fault type.

6. The method of claim 1, wherein measuring a magnetic field associated with the electric machine comprises measuring a magnetic field while the electric machine is online.

7. The method of claim 1, wherein measuring a magnetic field associated with the electric machine at a plurality of points external to the electric machine comprises measuring the magnetic field utilizing a plurality of magnetometers corresponding to the plurality of points.

8. A system for monitoring an electric machine, the system comprising:
   a plurality of sensors operable to measure a magnetic field associated with the electric machine at a plurality of respective points external to the electric machine; and
   a control unit operable to:
      receive the plurality of measurements from the plurality of sensors,
      determine a combined value of the magnetic field based at least in part on the plurality of measurements,
      compare the combined value to one or more expected combined values of the magnetic field, and
      determine, based at least in part on the comparison, whether a fault is present in the electric machine.

9. The system of claim 8, wherein the control unit comprises at least one memory operable to store the one or more expected combined values of the magnetic field.

10. The system of claim 8, wherein the control unit is further operable to determine the combined value of the magnetic field based at least in part on an integration of the plurality of measurements.

11. The system of claim 8, wherein the control unit is operable to compare the combined value of the magnetic field to one or more expected combined values by comparing the combined value of the magnetic field to one or more ranges of expected combined values.

12. The system of claim 8, wherein the control unit determines that a fault is present in the electric machine, and
   wherein the control unit is further operable to identify a fault type associated with the fault based at least in part on comparing the combined value of the magnetic field to one or more corresponding expected combined values associated with the fault type.

13. The system of claim 8, wherein the plurality of sensors are operable to measure the magnetic field associated with the electric machine while the electric machine is online.

14. The system of claim 8, wherein the plurality of sensors comprise magnetometers.

15. A method for monitoring an electric machine, the method comprising:
   determining, by a control unit comprising at least one computer and based upon a plurality of measurements of a magnetic field associated with the electric machine, a combined value for the magnetic field;
   comparing, by the control unit, the determined combined value to at least one corresponding expected value; and
   determining, based at least in part on the comparison, whether a fault is present in the electric machine.

16. The method of claim 15, wherein determining a combined value for the magnetic field based upon a plurality of measurements of the magnetic field comprises determining a combined value for the magnetic field based upon a plurality of measurements of the magnetic field taken at a plurality of points external to the electric machine.

17. The method of claim 16, wherein determining the combined value for the magnetic field comprises determining a combined value based at least in part on an integration of the plurality of measurements.

18. The method of claim 15, wherein comparing the determined combined value to at least one corresponding expected value comprises comparing the determined combined value to at least one corresponding range of expected values.

19. The method of claim 15, wherein a fault is determined to be present, and further comprising:
   identifying, by the control unit, a fault type associated with the fault.

20. The method of claim 15, wherein determining a combined value for the magnetic field associated with the electric machine comprises determining a combined value while the electric machine is online.

* * * * *